(12) United States Patent
Biber et al.

(10) Patent No.: US 8,901,929 B2
(45) Date of Patent: Dec. 2, 2014

(54) D-SHAPED COIL

(75) Inventors: Stephan Biber, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 238 days.

(21) Appl. No.: 13/171,422

(22) Filed: Jun. 28, 2011

(65) Prior Publication Data

US 2012/0161772 A1 Jun. 28, 2012

(30) Foreign Application Priority Data

Jul. 2, 2010 (DE) .................. 10 2010 025 919

(51) Int. Cl.
*G01V 3/00* (2006.01)
*G01R 33/3415* (2006.01)
*G01R 33/34* (2006.01)

(52) U.S. Cl.
CPC ...... *G01R 33/3415* (2013.01); *G01R 33/34007* (2013.01); *G01R 33/34023* (2013.01); *G01T 33/34015* (2013.01)
USPC .......................................... 324/318; 324/322

(58) Field of Classification Search
USPC ................... 324/318, 319, 320, 322; 600/421
See application file for complete search history.

(56) References Cited

U.S. PATENT DOCUMENTS

| | | | |
|---|---|---|---|
| 4,956,609 A | 9/1990 | Miyajima | |
| 5,065,760 A * | 11/1991 | Krause et al. | 600/421 |
| 7,015,692 B2 * | 3/2006 | Clarke et al. | 324/300 |
| 7,345,481 B2 * | 3/2008 | Leussler | 324/318 |
| 7,417,432 B2 | 8/2008 | Overweg | |
| 7,525,311 B2 * | 4/2009 | Steckner | 324/318 |
| 7,570,056 B2 * | 8/2009 | Nakabayashi et al. | 324/318 |
| 2005/0030028 A1 | 2/2005 | Clarke et al. | |
| 2008/0015430 A1 | 1/2008 | Takamori | |
| 2008/0094064 A1 | 4/2008 | Eberler et al. | |
| 2008/0204023 A1 | 8/2008 | Du et al. | |
| 2010/0213939 A1 | 8/2010 | Sodickson et al. | |

FOREIGN PATENT DOCUMENTS

| | | |
|---|---|---|
| CN | 1623504 A | 6/2005 |
| CN | 1926442 A | 3/2007 |
| CN | 101103916 A | 1/2008 |
| DE | 103 14 215 B4 | 11/2006 |
| EP | 0 955 554 A2 | 11/1999 |
| GB | 2 315 127 A | 1/1998 |
| WO | WO 2005/088330 A1 | 9/2005 |

OTHER PUBLICATIONS

German Office Action dated Apr. 7, 2011 for corresponding German Patent Application No. DE 10 2010 025 919.5-35 with English translation.
Chinese Office Action dated Jul. 25, 2013 for corresponding Chinese Patent Application No. 201110183654.9 with English translation.
Chinese Office Action dated Jan. 24, 2013 for corresponding Chinese Patent Application No. CN 20110183654.9 with English translation.

* cited by examiner

*Primary Examiner* — Louis Arana
(74) *Attorney, Agent, or Firm* — Lempia Summerfield Katz LLC

(57) ABSTRACT

The present embodiments relates to a magnetic resonance tomography system having a coil system. The coil system includes an upper part having at least one antenna and a lower part having at least one antenna. The upper part of the coil arrangement is disposed above a bore for receiving an examination subject. The lower part of the coil arrangement is disposed below a field of view of the magnetic resonance tomography system. The lower part of the coil arrangement is closer to the examination subject than the upper part of the coil arrangement.

26 Claims, 5 Drawing Sheets

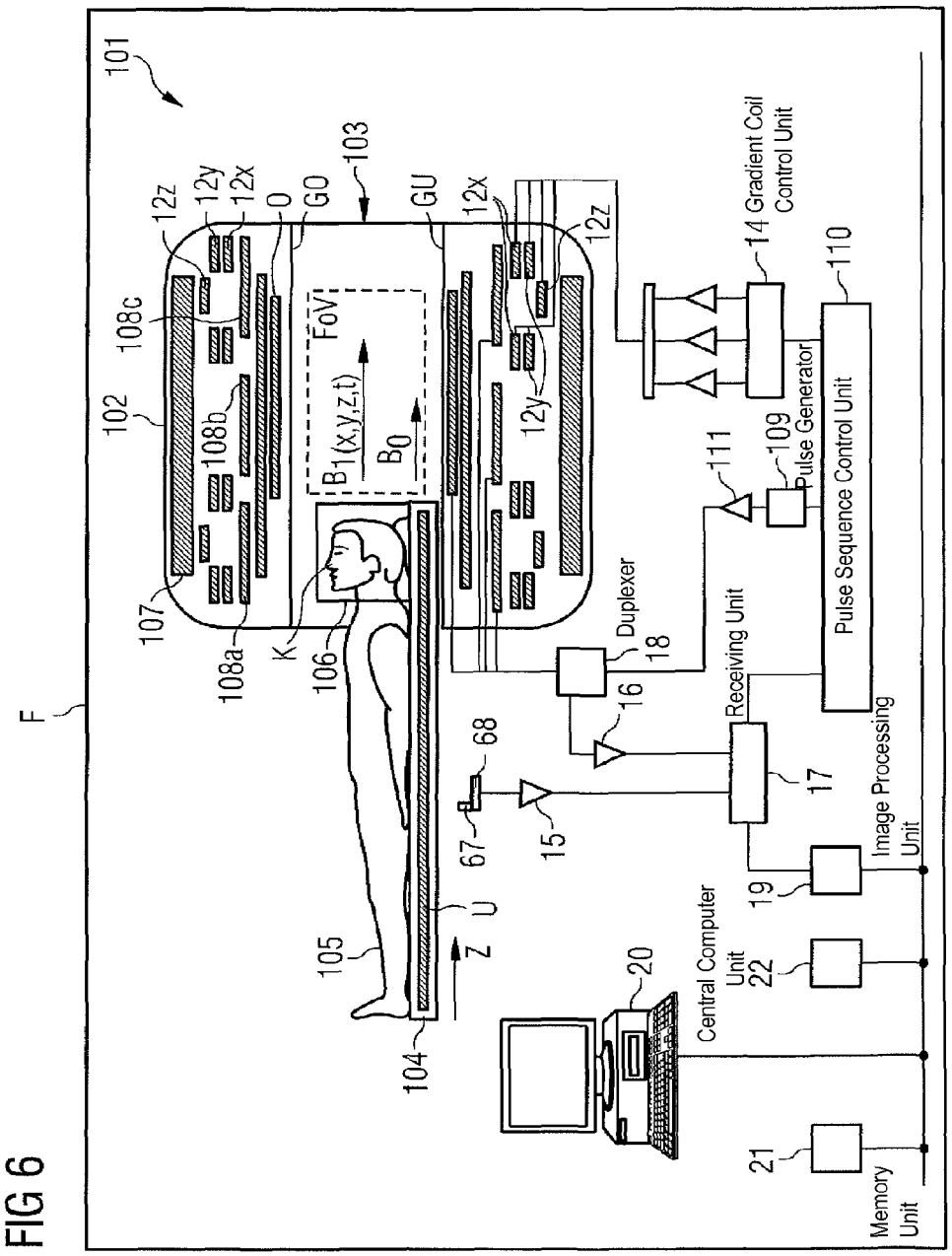

D-SHAPED COIL

This application claims the benefit of DE 10 2010 025 919.5, filed Jul. 2, 2010.

BACKGROUND

The present embodiments relate to a coil arrangement for a magnetic resonance tomography system.

Magnetic resonance devices for examining objects or patients using magnetic resonance tomography (e.g., magnetic resonance imaging) are known, for example, from DE10314215B4, U.S. Ser. No. 12/392,537, US20080094064A1 and U.S. Pat. No. 7,417,432B2.

In MR tomography, images having a high signal-to-noise ratio are acquired using local coil arrangements (e.g., loops, local coils). MR tomography includes exciting nuclei of an examination subject (e.g., a patient) to emit radiation, causing a voltage to be induced in a coil receiving the radiation. The voltage is amplified using a low-noise preamplifier (e.g., LNA) and forwarded at the MR frequency via cable to receive electronics. In order to improve the signal-to-noise ratio, including in the case of high-resolution images, use is made of high-field systems. The basic field strengths of the high-field systems range up to around 3 Tesla and higher. Since the high-field system enables more coil elements (e.g., loops) to be connected to an MR receiving system than there are receivers present, a switching array (e.g., an RCCS), for example, is installed between receive antennas and receivers. The switching array routes the currently active receive channels to the receivers present. This enables more coil elements to be connected than there are receivers present, since in the case of whole-body coverage, coils that are located in the field of view (FoV) or in the homogeneity volume of the magnet may only be read out.

In the following description, the individual antennas of a coil arrangement are also referred to as coil elements. A coil arrangement may include one coil element or (in the case of an array coil) a plurality of coil elements. A coil arrangement includes (e.g., in the case of a local coil) the coil elements (e.g., antennas), the preamplifier, further electronics and cabling, a housing, and may include a cable with plug, using which the coil arrangement is connected to the system. An "MRT system" may be an MR scanner facility. A patient, for example, lies in an MR scanner on a spine array coil integrated in a table (e.g., a patient couch) and, for example, on the lower part (posterior part) of a head coil. All the other coils or coil parts (e.g., anterior part head, anterior abdomen coils (body matrix), peripheral angio array (PAA) coils) may be attached close to the body on the anterior side (e.g., upper side) of the patient. In this case, some of the coils are placed directly onto the patient (e.g., body matrix coil, PAA), or the coils enclose the anatomy of the patient close to the body (e.g., a head coil).

Imaging using a body coil alone as a receive antenna does not produce the desired image quality, and this approach is not suited for use in parallel imaging. When local coils are disposed at a greater distance from the patient, the inherent noise of the local coil becomes increasingly dominant, leading to poor image quality, for which reason the coils may be deployed as close as possible to the body.

SUMMARY

The present embodiments may obviate one or more of the drawbacks or limitations in the related art. For example, the generation of magnetic resonance tomography (MRT) images may be optimized.

BRIEF DESCRIPTION OF THE DRAWINGS

FIG. 6 schematically shows an MRT system.

DETAILED DESCRIPTION OF THE DRAWINGS

Figure 1:
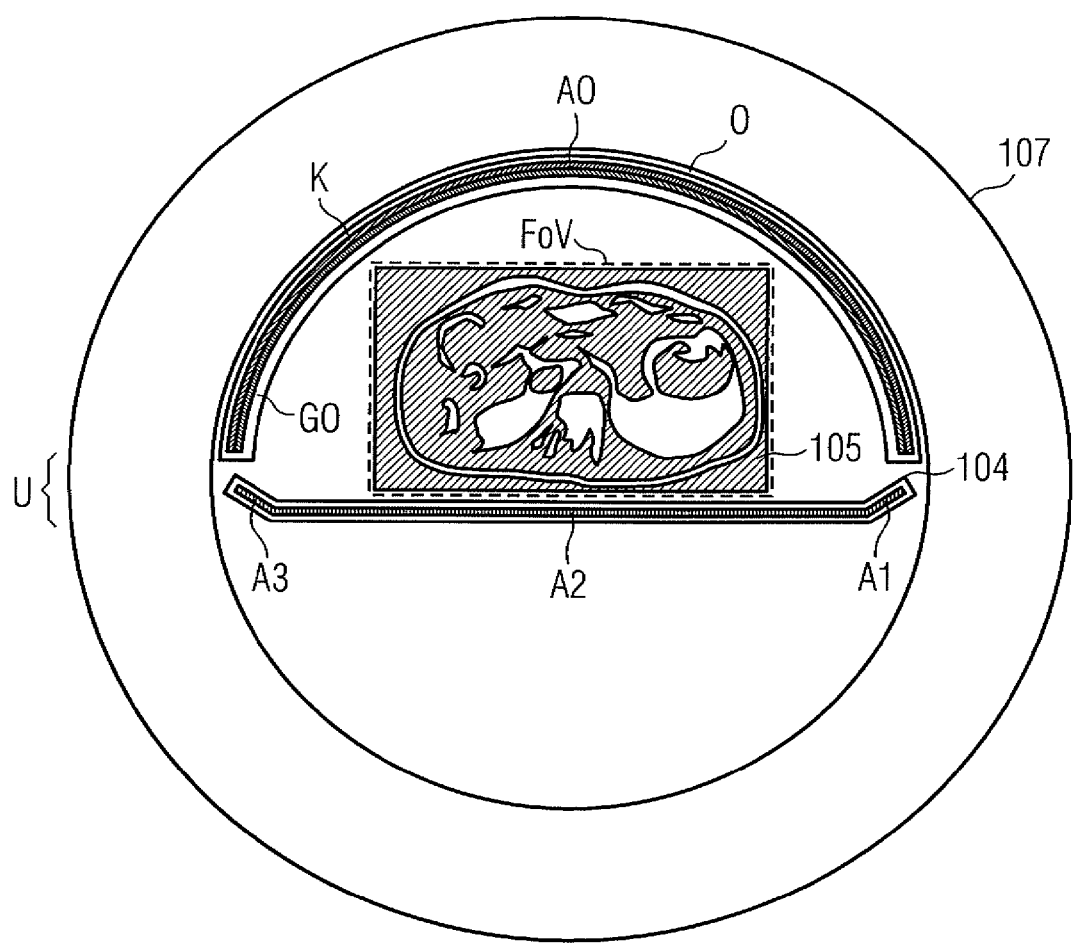
FIG. 1 shows a cross-section view of one embodiment of a magnetic resonance tomography (MRT) system.

FIG. 6 shows (in a room isolated using a Faraday cage F) an imaging magnetic resonance device MRT 101 having a whole-body coil 102 with a tubular or laterally open (e.g., enclosing a field of view FoV of the MRT 101 at top (GO) and bottom (GU) using a housing wall MRT 101) examination subject receiving bore 103 (e.g., a round bore or a C-shaped opening). A patient couch 104 supporting an examination subject such as, for example, a patient 105 (e.g., with a local coil arrangement or local coil system 106) may be introduced into the examination subject receiving bore 103 in the direction of the arrow z in order to generate images of the patient 105. A local coil arrangement 106, using which images of a local region (e.g., the head K) may be acquired when the patient 105 is moved in the direction z into the field of view FoV, may be placed on the patient 105. Signals of the local coil arrangement 106 may be evaluated (e.g., converted into images and stored or displayed) by an evaluation device (e.g., elements 67, 66, 15, 17) that is associated with the imaging magnetic resonance device MRT 101 and may be connected to the local coil arrangement 106 (e.g., via coaxial cable or radio link).

In order to examine a body 105 (e.g., the examination subject or the patient) using the magnetic resonance device MRT 101 using magnetic resonance imaging, different magnetic fields that are coordinated with one another in terms of temporal and spatial characteristics are applied to the body 105. A strong magnet (e.g., a cryomagnet 107 in a measurement chamber having a tunnel-shaped bore 3) generates a strong static main magnetic field $B_0$ in the range from, for example, 0.2 Tesla to 3 Tesla or more. The body 105 that is to be examined, positioned on the patient couch 104, is moved into a region of the main magnetic field $B_0$ that is approximately homogeneous in the field of view FoV. Nuclear spins of atomic nuclei of the body 105 are excited via magnetic radio-frequency excitation pulses that are transmitted via a radio-frequency antenna shown in simplified form in FIG. 6 as a body coil 108 and/or a local coil arrangement (e.g., radio frequency antennas). Radio-frequency excitation pulses are generated, for example, by a pulse generation unit 109 that is controlled by a pulse sequence control unit 110. After being amplified by a radio-frequency amplifier 111, the radio-frequency excitation pulses are routed to the radio-frequency antenna 108 a, b, c. The radio-frequency system shown in FIG. 6 is indicated schematically. In other embodiments, more than one pulse generation unit 109, more than one radio-frequency amplifier 111 and a plurality of radio-frequency antennas 108 a, b, c are used in the imaging magnetic resonance device MRT 101.

The imaging magnetic resonance device MRT 101 also has gradient coils 12x, 12y, 12z, using which magnetic gradient fields are radiated in the course of a measurement in order to produce selective layer excitation and for spatial encoding of the measurement signal. The gradient coils 12x, 12y, 12z are controlled by a gradient coil control unit 14 that, like the pulse generation unit 109, is connected to the pulse sequence control unit 110.

The signals emitted by the excited nuclear spins are received by the body coil 108a, 108b, 108c and/or at least one local coil arrangement 106, amplified by associated radio-frequency preamplifiers 16, and processed further and digitized by a receiving unit 17. The recorded measurement data is digitized and stored in the form of complex numeric values in a k-space matrix. An associated MR image may be reconstructed using a multidimensional Fourier transform from the value-filled k-space matrix.

In the case of a coil that may be operated both in transmit and in receive mode (e.g., the body coil 108 a, b, c, or a local coil), correct signal forwarding is controlled using an upstream-connected duplexer 18.

From the measurement data, an image processing unit 19 generates an image that is displayed to a user via an operator console 20 and/or stored in a memory unit 21. A central computer unit 22 controls the individual system components.

In MR tomography, images having a high signal-to-noise ratio (SNR) may be acquired using local coil arrangements (e.g., loops, local coils). The local coil arrangements are antenna systems that are mounted in immediate proximity to (e.g., on (anterior), under (posterior) or in) the body. In the course of an MR measurement, the excited nuclei induce a voltage in the individual antennas of the local coil. The induced voltage is amplified using a low-noise preamplifier (e.g., LNA, preamp) and forwarded to the receive electronics. High-field systems (e.g., 1.5 T or 3 T and more) are employed even in the case of high-resolution images in order to improve the SNR. Since more individual antennas may be connected to a magnetic resonance (MR) receiving system than there are receivers present, a switching array (e.g., RCCS) is installed between receive antennas and receivers. The switching array routes the currently active receive channels (e.g., the receive channels currently lying in the field of view of the magnet) to the receivers present. This enables more coil elements to be connected than there are receivers present, since in the case of whole-body coverage, coils that are located in the field of view FoV or in the homogeneity volume of the magnet may only be read out.

The local coil system 106 may include, for example, one antenna element or a plurality of antenna elements (e.g., coil elements) configured as an array coil. The local coil system 106 includes, for example, coil elements, a preamplifier, further electronics, a housing, supports, and a radio link or a cable with plug, using which the local coil system 106 is connected to the MRT system. A receiver 68 mounted on the system side filters and digitizes signals received, for example, wirelessly or via cable by the local coil system 106 and passes the data to a digital signal processing unit that may derive an image or a spectrum from the data acquired using a measurement and makes the image available to a user, for example, for subsequent diagnosis by the user or for storage in a memory.

Exemplary embodiments that are depicted in FIGS. 1-5 are described below.

FIG. 1 shows schematically in cross-section components of one embodiment of an imaging magnetic resonance device MRT system 101 having a coil system (e.g., a coil arrangement) that includes an upper part O having at least one antenna AO. The coil system also includes a lower part U having, for example, a plurality of antennas A1-A3. The upper part O of the coil arrangement is disposed above a bore 103 for receiving an examination subject 105 introduced into the bore 103, while the lower part U of the coil arrangement is disposed below a field of view FoV. The lower part U of the coil arrangement is closer to the examination subject 105 than the upper part O of the coil arrangement.

The upper part O of the coil system is an anterior part in relation to the patient 105 positioned in a supine position on a patient couch.

The lower part U is a posterior part in relation to the patient 105 positioned in the supine position on the patient couch.

As shown in the embodiment in FIG. 1, the lower part U of the coil arrangement is integrated in the patient couch 104 for the examination subject 105, or is suitable for use in the patient couch 104.

In one embodiment, the lower part U of the coil arrangement is disposed below the field of view FoV of the imaging magnetic resonance device MRT 101 only when the examination subject 105 and the patient couch 104 are located in the field of view FoV of the imaging magnetic resonance device MRT 101.

Figure 3:
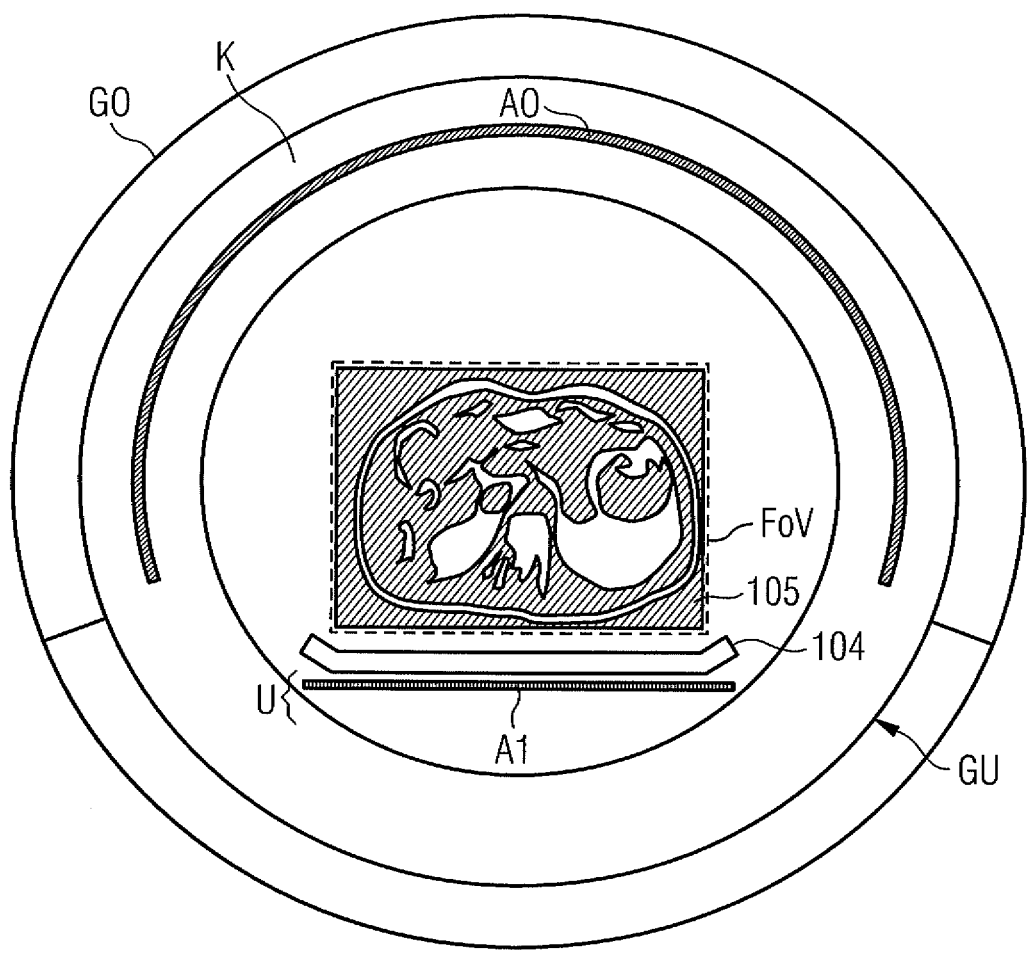
FIG. 3 shows a cross-section view of one embodiment of an MRT system.

Alternatively, the lower part U of the coil arrangement is disposed, for example, according to FIG. 3, at a section GU of a housing wall GO, GU (e.g., at least partially enclosing at least the field of view FoV) of the imaging magnetic resonance device 101. The housing wall section GU is located below the field of view FoV of the imaging magnetic resonance device MRT 101.

Figure 4:
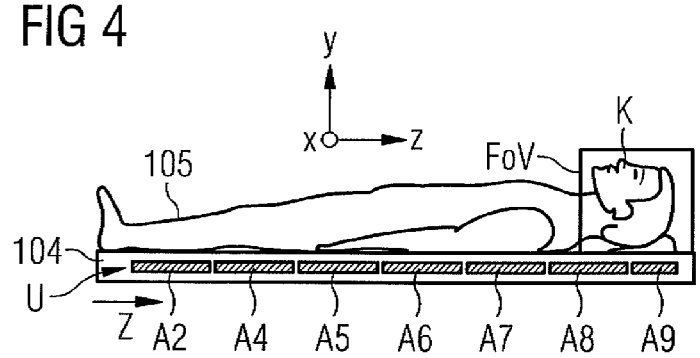
FIG. 4 shows a longitudinal section of a patient couch.
Figure 5:
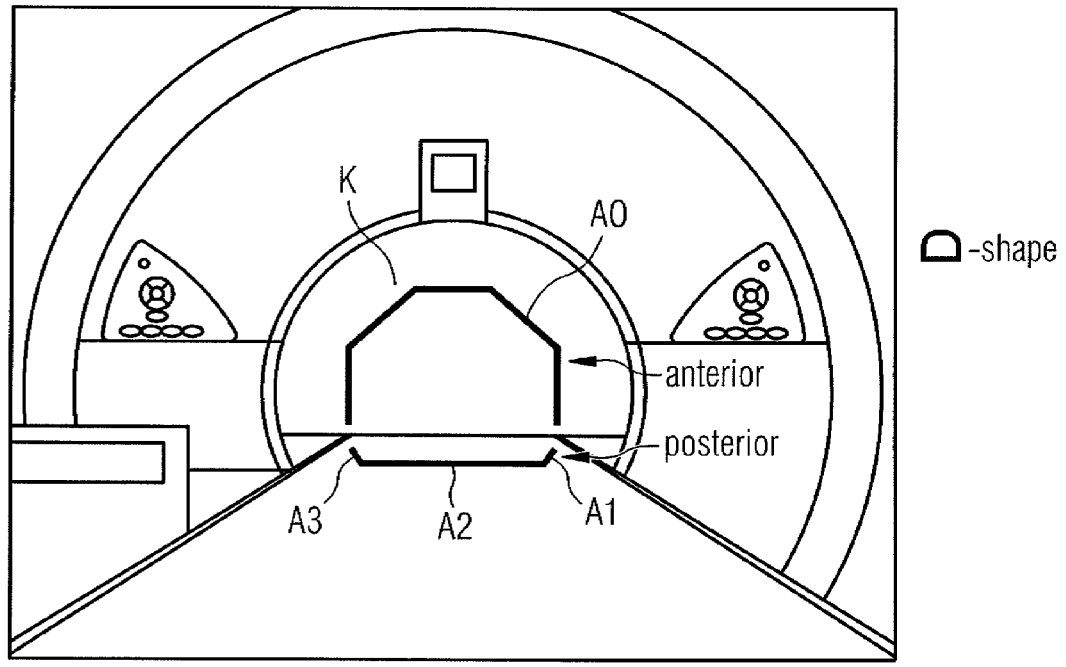
FIG. 5 shows a cross-section view of one embodiment of an MRT system.

As FIG. 4 shows, the lower part U of the coil arrangement may include a plurality of antennas A2, A4, A5, A6, A7, A8, A9 that may lie adjacent to one another on an axis (z), for example, viewed in the direction (z), in which the examination subject may be introduced into the MRT bore 103.

Figure 2:
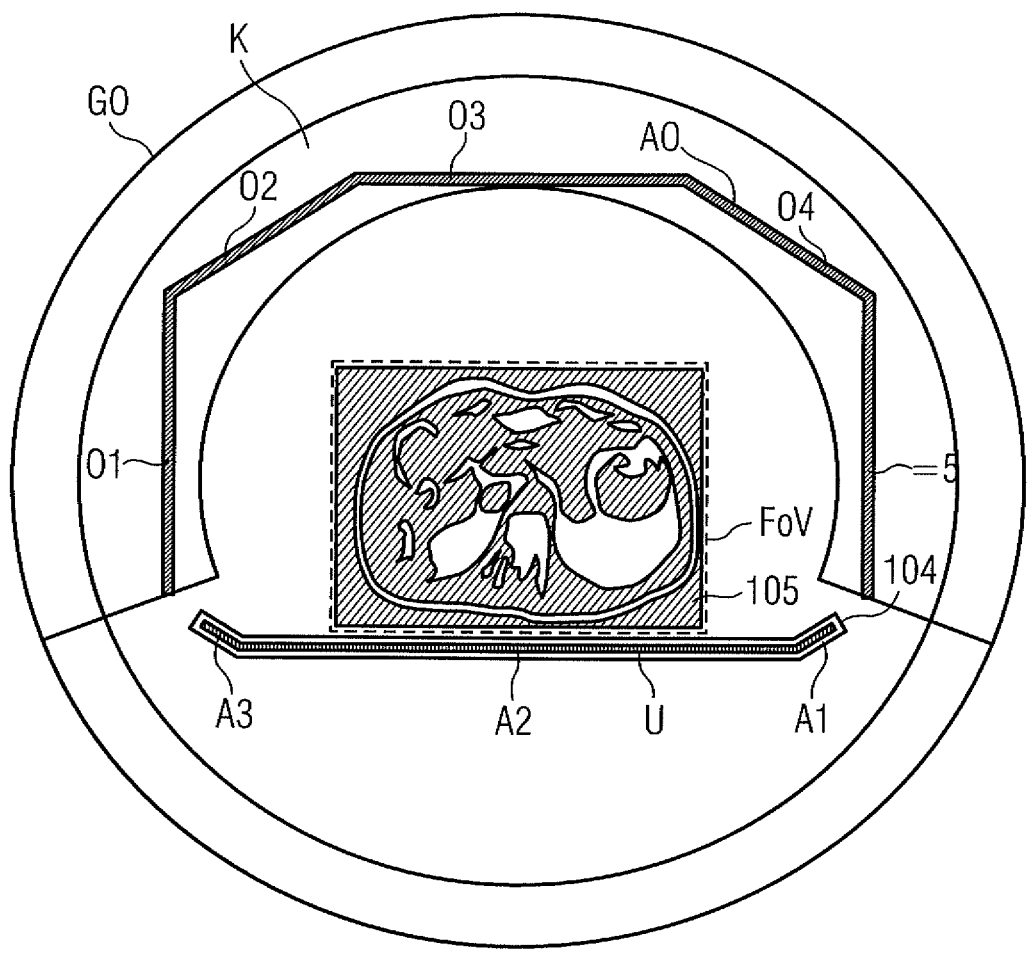
FIG. 2 shows a cross-section view of one embodiment of an MRT system.

As FIG. 2 shows, the lower part U of the coil arrangement may additionally or alternatively include multiple antennas A1, A2, A3 that, viewed vertically to the direction z, in which the examination subject 105 may be introduced into the MRT bore 103, lie adjacent to one another on an axis x.

As FIG. 2 shows, the upper part O of the coil arrangement may be disposed above the housing wall section GO of a housing wall GO, GU (or 107) (e.g., at least partially enclosing at least the field of view FoV) of the imaging magnetic resonance device MRT 101. The housing wall section GO is located above the field of view FoV of the imaging magnetic resonance device MRT 101.

The upper part O may also be disposed in a housing of the MRT 101, in which a basic field magnet of the MRT 101 is also disposed, and, for example, may also be connected to a cooling system of the housing of the MRT 101 (or to a separate dedicated cooling system).

As the figures show, the upper part O may be disposed at a much further distance away from the examination subject 105 than the lower part U (e.g., a multiple further away; ten times further away).

In the embodiment shown in FIG. 3, cooling K is provided for only one of the upper part O and the lower part U of the coil arrangement (e.g., for the upper part O only).

The cooled part (e.g., the upper part O) of the coil arrangement may be colder than 150 K (e.g., colder than 100K) or may be cooled in a superconducting manner.

The antennas of the upper part O and of the lower part U of the coil arrangement essentially receive, apart from unwanted stray effects, only radiation coming from a portion K of the examination subject 105 lying in the field of view FoV of the MRT 101.

The MRT 101 may operate without local coil elements placed on the examination subject.

In addition to the upper part O and lower part U, the MRT 101 may also include a whole-body coil 102 integrated in the imaging magnetic resonance device 101.

As FIGS. 1-5 show, the upper part O of the coil arrangement may have a different number of antennas and/or antennas of different shapes and/or antennas having other decoupling mechanisms than the lower part U.

The antenna system of the present embodiments for a magnetic resonance MR system (e.g., which may operate without local coils placed on the patient) includes a, for example, "D"-shaped shell for arranging the array antennas.

The lower part U of the D-shaped shell is, for example, integrated in the patient table 104. Alternatively, the lower part U is permanently installed in the bore (MRT housing at the bore 103 of the MRT 101), and the patient table 104 travels across over the lower coil part U at a close distance therefrom.

The antennas may be constructed similar in design to a spine array coil and may not be cooled, since for the antennas A1 to A9 of the lower part that are disposed close to the body, the resistance of the patient dominates, and a cooling of the antennas in the case of high-field systems may enable only minor (e.g., technically less relevant) improvement. The upper part O of the antennas (the curve of the, for example, "D") is integrated into the bore wall of the MRT 101 and is far away from the patient 105 (e.g., compared with the lower part U).

In one embodiment, the upper part O of the antenna includes a cooling apparatus K in order to improve the quality of the antenna array O (e.g., usable as an RX and/or as a TX array). In the antenna parts AO that are remote from the patient, the cooling effects a noticeable reduction in the noise component coming from the antenna AO and consequently leads to a significant improvement in image quality. The cooled part of the antenna may only be cold (e.g., 77K) or may be superconducting.

Antennas may be implemented on the anterior (O) and posterior (U) part in different shapes and with different numbers of elements and different decoupling mechanisms (e.g., capacitive, inductive).

Antenna arrays of a lower (posterior) part of the antenna system are installed in the posterior section closely to the patient (e.g., in the same way as previous local coils). Only in the anterior section are transmit and/or receive coils (e.g., RX and/or TX arrays) disposed at a comparatively great distance from the patient 105.

An arrangement according to the present embodiments enables, for example, spine imaging and other applications to anticipate receiving the accustomed high image quality of a posterior antenna array. The system offers the advantage that there is no requirement for anteriorly mounted local coils by virtue of the fact that the array is disposed far away from the patient 105 (e.g., above the patient in an MRT bore housing) in the anterior section, for example.

If the upper or anterior part of the antenna array is cooled, the antennas benefit from the cooling, which is associated with a high energy and infrastructure overhead.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography (MRT) system comprising:
   a bore for receiving an examination subject; and
   a coil system comprising:
   an upper part having a first antenna; and
   a lower part having a second antenna, wherein the first antenna and the second antenna are separate from each other,
   wherein the upper part of the coil system is disposed above the bore,
   wherein the lower part of the coil system is disposed below a field of view of the MRT system,
   wherein at least a part of the lower part of the coil system is closer to the examination subject than any part of the upper part of the coil system, and
   wherein cooling is provided for only one of the upper part and the lower part.

2. The MRT system as claimed in claim 1, further comprising a whole-body coil integrated into the MRT system.

3. The MRT system as claimed in claim 1, wherein the upper part is an anterior part in relation to a patient positioned in a supine position on a patient couch, and
   wherein the lower part is a posterior part in relation to the patient positioned in the supine position on the patient couch.

4. The MRT system as claimed in claim 1, further comprising a housing wall having a housing wall section, the housing wall section being located below a field of view of the MRT system,
   wherein the lower part of the coil system is disposed at the housing wall section.

5. The MRT system as claimed in claim 1, further comprising a patient couch for the examination subject,
   wherein the lower part is integrated in the patient couch or suitable for use in the patient couch.

6. The MRT system as claimed in claim 1, wherein the lower part comprises a plurality of antennas that, viewed in a direction, in which the examination subject is introducible into the bore, lie adjacent to one another on an axis, the plurality of antennas including the second antenna.

7. The MRT system as claimed in claim 1, wherein the lower part comprises a plurality of antennas that, viewed vertically to a direction, in which the examination subject is introducible into the bore, lie adjacent to one another on a straight line.

8. The MRT system as claimed in claim 1, wherein the upper part of the coil system is disposed above a section of a housing wall of the MRT system, the section of the housing wall being located above a field of view of the MRT system.

9. The MRT system as claimed in claim 1, wherein the upper part of the coil system is disposed above a section of a housing wall of the MRT system, the housing wall at least partially enclosing at least a field of view of the MRT system, the section of the housing wall being located above the field of view of the MRT system.

10. The MRT system as claimed in claim 1, further comprising:
    a housing; and
    a basic field magnet disposed in the housing,
    wherein the upper part is disposed in the housing.

11. The MRT system as claimed in claim 1, wherein the upper part is disposed further away from the examination subject than the lower part.

12. The MRT system as claimed in claim 1, wherein the upper part is curved in cross-section or comprises a plurality of sections disposed relative to one another at an angle of less than 45 degrees to one another.

13. The MRT system as claimed in claim 1, wherein cooling is provided for the upper part only.

14. The MRT system as claimed in claim 1, wherein the cooled part of the coil system is colder than 150 K.

15. The MRT system as claimed in claim 14, wherein the cooled part of the coil system is colder than 100 K.

16. The MRT system as claimed in claim 1, wherein superconducting cooling is provided for cooling only the upper part of the coil system.

17. The MRT system as claimed in claim 1, wherein the upper part, the lower part, or the upper part and the lower part comprise a plurality of antennas, the plurality of antennas comprising the first antenna and the second antenna.

18. The MRT system as claimed in claim 1, wherein the first antenna, the second antenna, or the first antenna and the second antenna are part of a coil arrangement, using which essentially only radiation coming from a portion of the examination subject lying in a field of view of the MRT system is received.

19. The MRT system as claimed in claim 1, wherein the MRT system is configured to operate without local coil elements positioned on the examination subject.

20. The MRT system as claimed in claim 1, wherein the MRT system is configured to receive, evaluate, or receive and evaluate only radiation emitted by the examination subject via the upper part and the lower part of the coil system.

21. The MRT system as claimed in claim 1, wherein the upper part and the lower part of the coil system together enclose more than 95% of the field of view.

22. The MRT system as claimed in claim 1, wherein the lower part is disposed below a field of view of the MRT system at all times, or only when the examination subject, a patient couch, or the examination subject and the patient couch are located in the MRT system.

23. The MRT system as claimed in claim 1, wherein the upper part has a different number of antennas, antennas of different shapes, antennas having other decoupling mechanisms than the lower part, or a combination thereof.

24. The MRT system as claimed in claim 1, wherein the upper part and the lower part are not conductively connected to each other, are non-conductively separated from each other, or are electrically isolated from each other.

25. The MRT system as claimed in claim 1, wherein the upper part and the lower part of the coil system together enclose more than 99% of the field of view.

26. A magnetic resonance tomography (MRT) system comprising:
    a bore for receiving an examination subject; and
    a coil system comprising:
        an upper part having a first antenna; and
        a lower part having a second antenna, wherein the first antenna and the second antenna are separate from each other,
    wherein the upper part of the coil system is disposed above the bore,
    wherein the lower part of the coil system is disposed below a field of view of the MRT system,
    wherein at least a part of the lower part of the coil system is closer to the examination subject than any part of the upper part of the coil system, and
    wherein superconducting cooling is provided for cooling only the upper part of the coil system.

* * * * *